United States Patent

Ho

(10) Patent No.: US 10,314,174 B2
(45) Date of Patent: Jun. 4, 2019

(54) METHOD FOR MANUFACTURING CIRCUIT BOARD

(71) Applicant: Winbond Electronics Corp., Taichung (TW)

(72) Inventor: Yu-Hsuan Ho, Taoyuan (TW)

(73) Assignee: Winbond Electronics Corp., Taichung (TW)

(*) Notice: Subject to any disclaimer, the term of this patent is extended or adjusted under 35 U.S.C. 154(b) by 385 days.

(21) Appl. No.: 15/062,990

(22) Filed: Mar. 7, 2016

(65) Prior Publication Data

US 2017/0127529 A1  May 4, 2017

(30) Foreign Application Priority Data

Oct. 29, 2015  (TW) .............................. 104135552 A

(51) Int. Cl.
*B05D 5/12* (2006.01)
*H05K 3/12* (2006.01)

(52) U.S. Cl.
CPC ........... *H05K 3/125* (2013.01); *H05K 3/1208* (2013.01); *H05K 2201/09909* (2013.01); *H05K 2203/013* (2013.01)

(58) Field of Classification Search
None
See application file for complete search history.

(56) References Cited

U.S. PATENT DOCUMENTS

| | | | |
|---|---|---|---|
| 2005/0042320 A1* | 2/2005 | Hasei | H01L 27/3223 425/375 |
| 2006/0163744 A1* | 7/2006 | Vanheusden | B82Y 30/00 257/773 |
| 2007/0134832 A1* | 6/2007 | Oh | B82Y 10/00 438/30 |
| 2008/0175981 A1 | 7/2008 | Suzuki | |
| 2015/0104562 A1* | 4/2015 | Subbaraman | H05K 3/46 |

FOREIGN PATENT DOCUMENTS

JP   2007-49186 A   2/2007
KR   10-2011-0110950   10/2011

OTHER PUBLICATIONS

An Office Action issued in corresponding CN Application No. 201510799629.1 dated Aug. 28, 2018.

* cited by examiner

*Primary Examiner* — Austin Murata
(74) *Attorney, Agent, or Firm* — Muncy, Geissler, Olds & Lowe, P.C.

(57) ABSTRACT

A method for manufacturing a circuit board is provided, including providing a substrate. A first inkjet printing step is performed to apply a plurality of ink droplets to the substrate to form a plurality of microstructures arranged along a first direction. The microstructures therebetween form a plurality of recesses extended along a second direction that is different from the first direction. Also, a second inkjet printing step is performed to apply a plurality of conductive ink droplets to the microstructures, wherein the recesses between the microstructures are filled with the conductive ink droplets.

16 Claims, 4 Drawing Sheets

METHOD FOR MANUFACTURING CIRCUIT BOARD

CROSS REFERENCE TO RELATED APPLICATIONS

The present application claims priority of Taiwan Patent Application No. 104135552, filed on Oct. 29, 2015, the entirety of which is incorporated by reference herein.

BACKGROUND

Technical Field

The present application relates to a method for manufacturing a circuit board, and in particular to a method for manufacturing a circuit board in which binding stability between the substrate and circuits thereon is improved.

Description of the Related Art

Printed circuit boards (PCBs) are widely used in various electronic devices. Generally, a printed circuit board is used to support various electronic components and to create electrical connection between the electronic components.

In recent years, with the rise of printed electronics technology, the industry has also started to use inkjet printing technology to produce printed circuit boards, and there are hopes that this can reduce the production cost and further improve the environmental pollution problems caused by the fabrication of circuit boards.

However, the circuits formed by conventional inkjet printing technology can easily fail to adhere to the substrate of the printed circuit board, thus adversely affecting the reliability and life of the whole printed circuit board.

BRIEF SUMMARY OF THE DISCLOSURE

In view of the aforesaid problems, the invention provides a method utilizing inkjet printing technology for manufacturing a circuit board, wherein the method can improve the binding stability between the substrate and circuits thereon, and thus can increase the reliability and life of the whole circuit board.

An embodiment of the invention provides a method for manufacturing a circuit board, comprising: providing a substrate; performing a first inkjet printing step to apply a plurality of ink droplets to the substrate to form a plurality of microstructures arranged along a first direction, wherein the microstructures therebetween form a plurality of recesses extended along a second direction that is different from the first direction; and perform a second inkjet printing step to apply a plurality of conductive ink droplets to the microstructures, wherein the recesses between the microstructures are filled with the conductive ink droplets.

In some embodiments, the second direction is perpendicular to the first direction.

In some embodiments, the microstructures each have a substantially rectangular structure, and a major axis thereof is parallel to the second direction.

In some embodiments, the microstructures each have a length in the first direction that is smaller than a diameter of each conductive ink droplet.

In some embodiments, the microstructures are arranged periodically, and the conductive ink droplets are coated periodically on the microstructures, wherein an arrangement period of the microstructures is the same as a coating period of the conductive ink droplets.

In some embodiments, the microstructures each have a T-shaped cross section.

In some embodiments, the microstructures are further arranged along the second direction with a spacing therebetween and arranged along the first direction in a staggered manner.

In some embodiments, the spacing between the microstructures in the second direction is smaller than a diameter of each conductive ink droplet.

In some embodiments, the microstructures adhere to the substrate.

In some embodiments, the microstructures comprise non-conductive material.

In order to illustrate the purposes, features and advantages of the invention, the preferred embodiments and figures of the invention are shown in detail as follows

BRIEF DESCRIPTION OF THE DRAWINGS

The disclosure can be more fully understood by reading the subsequent detailed description and examples with references made to the accompanying drawings, wherein.

DETAILED DESCRIPTION OF THE DISCLOSURE

Figure 1A:
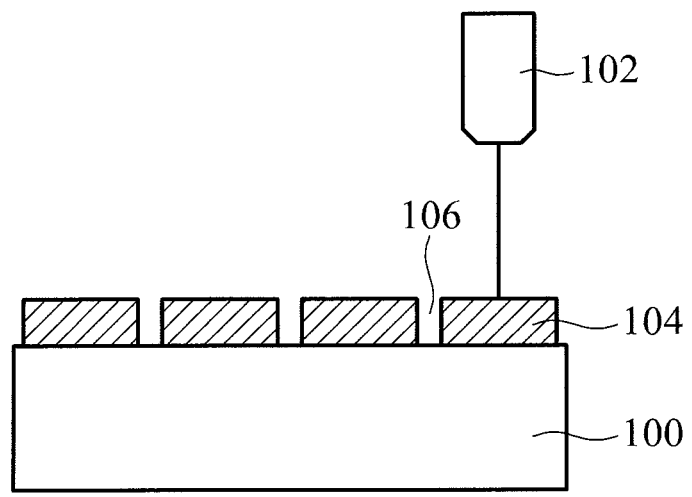
FIGS. 1A to 1B are cross sectional views of each stage of a method for manufacturing a circuit board in accordance with an embodiment of the invention.
Figure 1B:
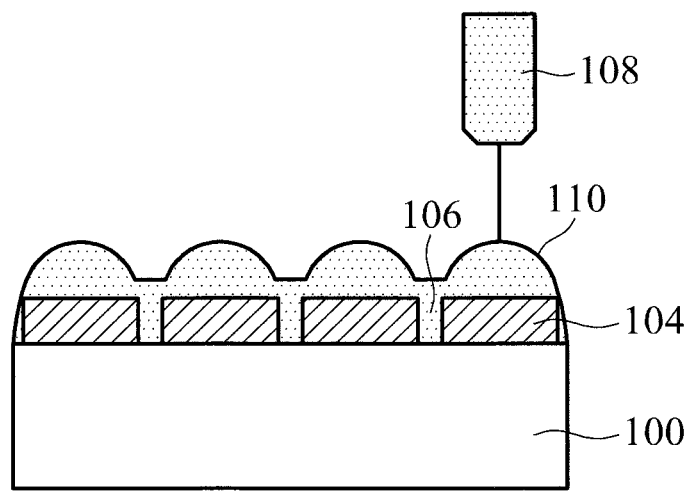

FIGS. 1A to 1B are cross sectional views of each stage of a method for manufacturing a circuit board in accordance with an embodiment of the invention. Referring to FIG. 1A, a substrate 100 is firstly provided. In some embodiments, the substrate 100 comprises a copper cladded laminate (CCL), a glass substrate or a plastic substrate.

Next, a first inkjet printing step is performed via an ink nozzle 102 to print a plurality of ink droplets on the substrate 100. Then, the ink droplets can form a plurality of microstructures 104 with fixed shape after being baked for a certain time at a certain temperature. In some embodiments, the ink droplets (i.e. the microstructures 104) comprise non-conductive material, such as plastic polymer and oxide, and can have high adhesion with the substrate 100. Moreover, there are several micrometer-sized recesses 106 formed between the microstructures 104.

Referring to FIG. 1B, after forming the microstructures 104 on the substrate 100, a second inkjet printing step is also performed via another ink nozzle 108 to print a plurality of conductive ink droplets 110 on the microstructures 104. Specifically, the conductive ink droplets 110 are prone to flow in and fill the recesses 106 between the microstructures 104, and then, they can be joined together. Subsequently, after being baked for a certain time at a certain temperature, the conductive ink droplets 110 can form a connected circuit or connected circuits. In some embodiments, the conductive ink droplets 110 comprise metal particles, such as gold, silver, nickel, copper, and/or aluminum particles and a dispersant. In some embodiments, the conductive ink droplets 110 may further comprise a binder.

Based on the method for manufacturing a circuit board provided in the aforesaid embodiments, an inkjet printing technology is used to firstly form a plurality of microstructures 104 on the substrate 100, wherein the microstructures 104 can highly adhere to the substrate 100, and then, the conductive ink droplets 110 are applied to the microstructures 104. Accordingly, it is equivalent to have a pre-surface treatment at the substrate 100 (the microstructures 104 can increase roughness of the surface of the substrate 100), so that the binding stability between the substrate 100 and the circuits (i.e. the conductive ink droplets 110) later applied to the substrate 100 can be greatly improved.

As the conductive ink droplets 110 dropped on the microstructures 104 can naturally flow in and fill the recesses 106 between the microstructures 104 and then be joined together, the continuity of circuits on the substrate 100 can also be effectively improved.

Moreover, forming the microstructures 104 and forming the circuits (i.e. the conductive ink droplets 110) use the same inkjet printing processes and equipment, so that an additional processing method (for example, an oxygen plasma treatment or other chemical surface roughening treatments) is not needed, and therefore the production cost and the complexity of the process can be reduced.

Further, various methods for manufacturing a circuit board in accordance with other some embodiments of the invention are illustrated as follows with references to FIG. 2 to FIG. 4.

Figure 2A:
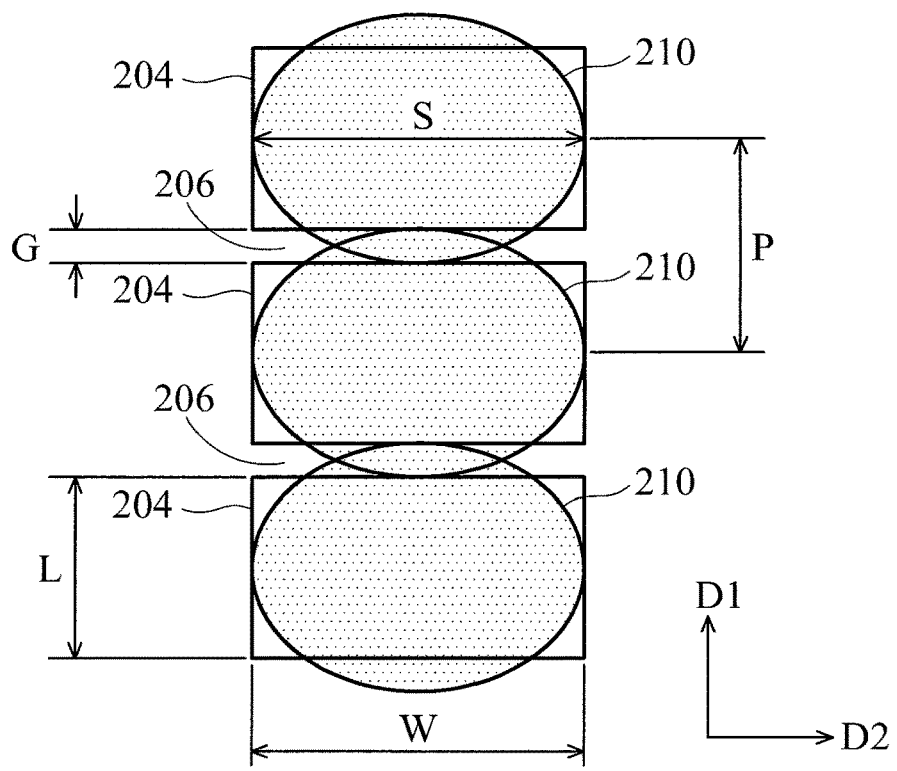
FIG. 2A is a plane view of the microstructures and conductive ink droplets formed by inkjet printing processes in accordance with an embodiment of the invention.

Referring to FIG. 2A, which is a plane view of the microstructures and conductive ink droplets formed by inkjet printing processes in accordance with an embodiment of the invention (in order to simply the drawing, the substrate of the circuit board is not shown). As shown in FIG. 2A, a plurality of microstructures 204 are formed and arranged along a first direction D1 on the substrate with a fixed period P (i.e. the distance between the centers of the microstructures 204). The microstructures 204 each have a substantially rectangular structure (the cross section is also rectangular, see FIG. 2B), and the major axis thereof is parallel to a second direction D2 which is different from the first direction D1. In this embodiment, the second direction D2 is perpendicular to the first direction D1, but the invention is not limited thereto. The shape of the microstructures 204 is determined by the shape of the ink nozzle 102 (FIG. 1A). In some embodiments, the arrangement period P of the microstructures 204 is about 10 to 250 micrometers.

Next, a plurality of conductive ink droplets 210 are also coated along the first direction D1 and arranged periodically on the microstructures 204. In this embodiment, the conductive ink droplets 210 have a coating period (i.e. the distance between the centers of the conductive ink droplets 210) that is the same as the arrangement period P of the microstructures 204.

As shown in FIG. 2A, the length L of each microstructure 204 in the first direction D1 is smaller than the diameter S of each conductive ink droplet 210, and the width W of each microstructure 204 in the second direction D2 is equal to or greater than the diameter S of each conductive ink droplet 210 (in this embodiment, the conductive ink droplets 210 are spherical droplets each having the same diameters S in the first direction D1 and second direction D2). In some embodiments, the length L of the microstructure 204 is about one-half to three-quarters of the diameter S of the conductive ink droplet 210 (i.e. L=0.5 S~0.75 S), and the width W of the microstructure 204 is about one to two times the diameter S of the conductive ink droplet 210 (i.e. W=S~2S). For example, the diameter S of the conductive ink droplet 210 is about 20 to 300 micrometers, the length L of the microstructure 204 is about 10 to 225 micrometers, and the width W of the microstructure 204 is about 20 to 600 micrometers.

Moreover, there are pluralities of recesses 206 between the microstructures 204 that extend in the second direction D2. Specifically, the recesses 206 each have a gap distance G in the first direction D1 approximately equaling the difference between the length L of the microstructure 204 in the first direction D1 and the arrangement period P of the microstructures 204 (i.e. G=P–L). In some embodiments, the gap distance G of the recess 206 is about 5 to 100 micrometers.

Figure 2B:
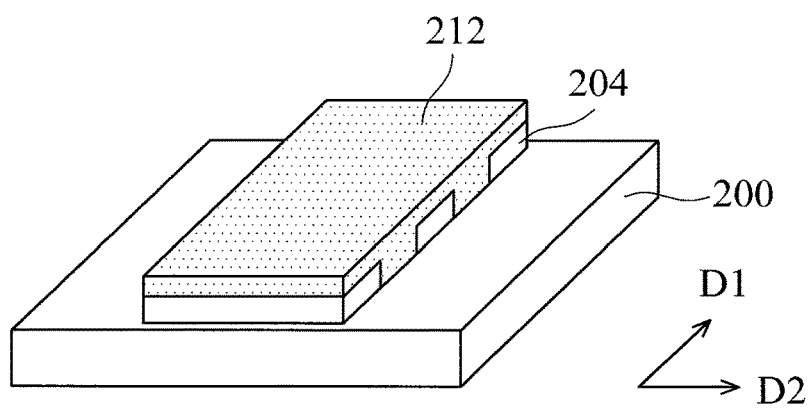
FIG. 2B is a perspective view of a circuit board formed by inkjet printing processes in accordance with an embodiment of the invention.

With the design described above, the conductive ink droplets 210 can exceed the microstructures 204 in the first direction D1 and naturally flow in and fill the recesses 206 between the microstructures 204. Then, the conductive ink droplets 210 are joined together. Subsequently, (the conductive ink droplets 210) after being baked for a certain time at a certain temperature, a circuit board as shown in FIG. 2B including a substrate 200 and a circuit 212 with great continuity thereon is achieved.

Figure 3A:
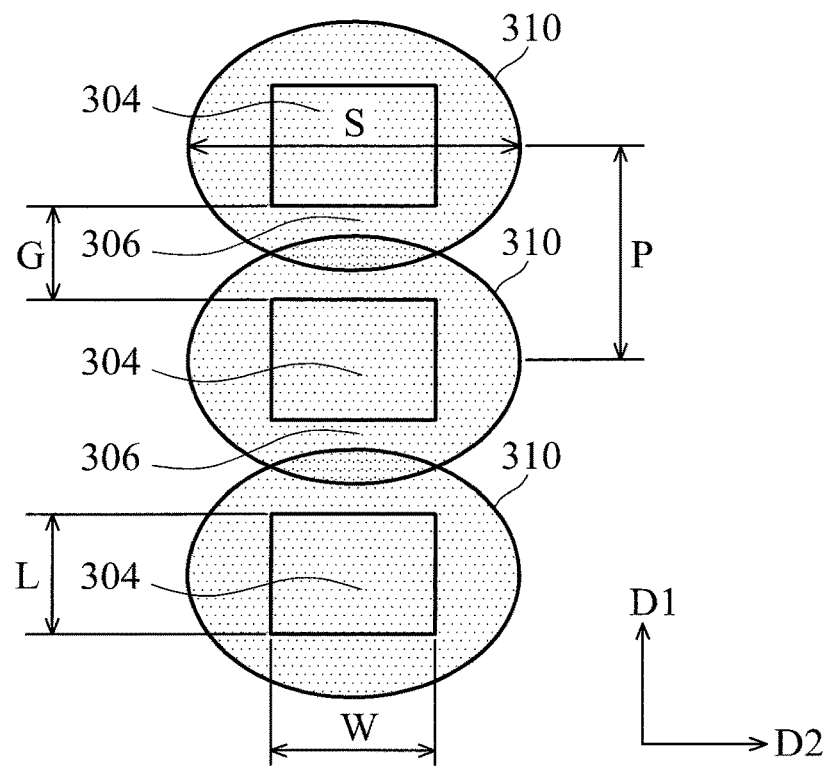
FIG. 3A is a plane view of the microstructures and conductive ink droplets formed by inkjet printing processes in accordance with another embodiment of the invention.
Figure 3B:
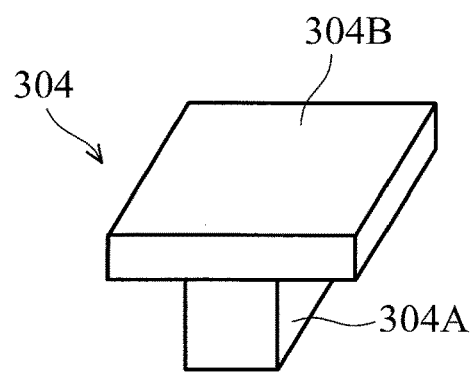
FIG. 3B is a perspective view of one of the microstructures in FIG. 3A.

FIG. 3A is a plane view of the microstructures and conductive ink droplets formed by inkjet printing processes in accordance with another embodiment of the invention (in order to simply the drawing, the substrate of the circuit board is not shown). FIG. 3B is a perspective view of one of the microstructures in FIG. 3A. As shown in FIGS. 3A and 3B, this embodiment differs from the embodiment of FIGS. 2A and 2B in that the microstructures 304 each have a T-shaped structure (the cross section thereof is T-shaped, see FIG. 3B). The T-shaped structure includes a lower portion 304A connected to the substrate and an upper portion 304B on the lower portion 304A, wherein the upper portion 304B has a substantially square structure, and the lower portion 304A has a substantially rectangular structure and the major axis thereof is parallel to the second direction D2. In some embodiments, the upper and lower portions 304A and 304B of the microstructure 304 can be formed by the same or different ink nozzles though repeated printing. Moreover, the recesses 306 formed between the microstructures 304 are also extending in the second direction D2.

As shown in FIG. 3A, the length L of each microstructure 304 in the first direction D1 is smaller than the diameter S of each conductive ink droplet 310, and the width W of each microstructure 304 in the second direction D2 is also smaller than the diameter S of each conductive ink droplet 310 (In this embodiment, the conductive ink droplets 310 are spherical droplets each having the same diameters S in the first direction D1 and second direction D2). For example, the length L and the width W of the microstructure 304 are both about one half of the diameter S of the conductive ink droplet 310 (i.e. L=W=0.5S).

Similarly, with the design described above, the conductive ink droplets 310 can exceed the microstructures 304 in the first direction D1 and naturally flow in and fill the recesses 306 between the microstructures 304. Then, the conductive ink droplets 310 are joined together. It should be realized that as the microstructure 304 have the design of T-shaped structure, it can further prevent the subsequently formed circuits from easily separating therefrom, so that the binding stability between the substrate and circuits thereon is increased.

Figure 4:
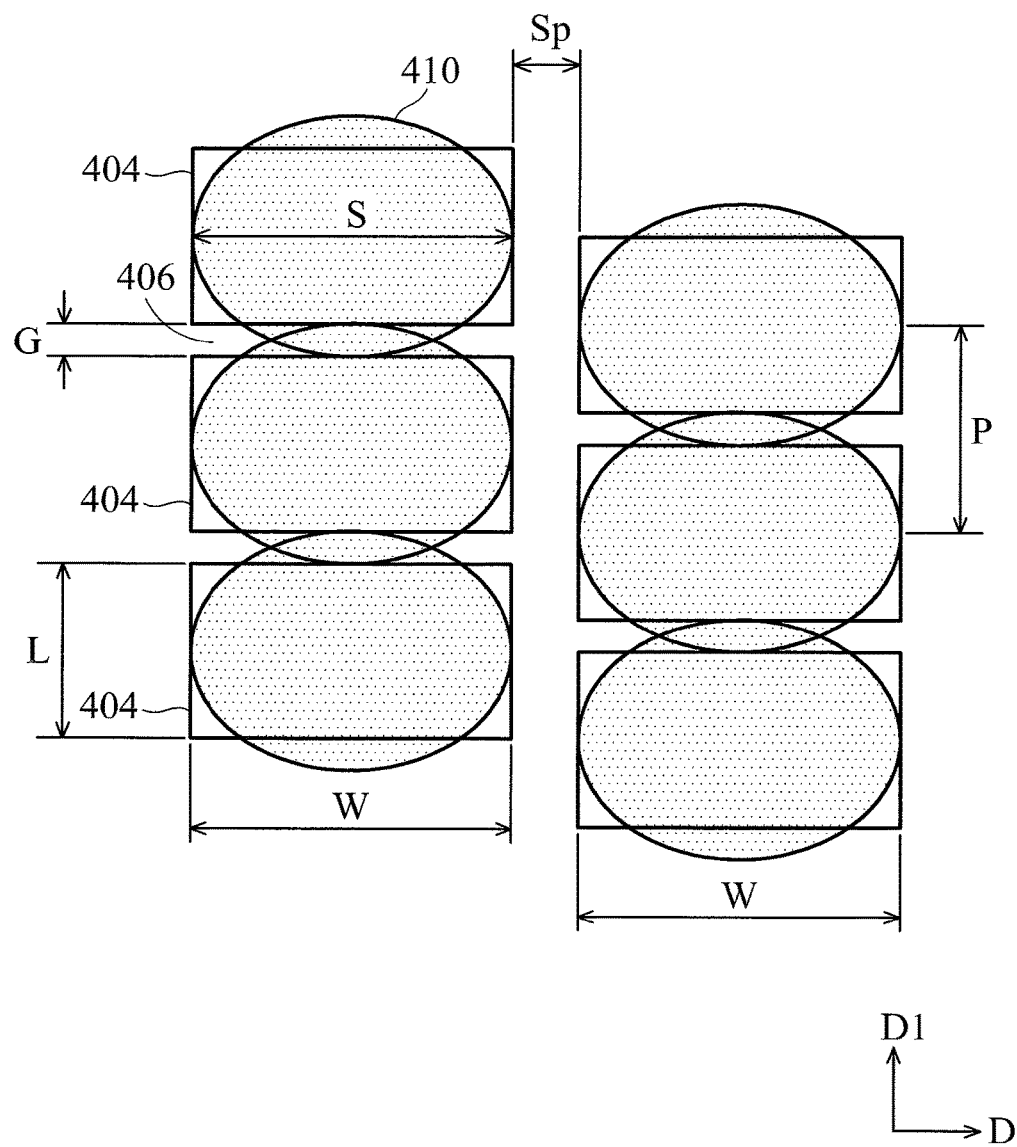
FIG. 4 is a plane view of the microstructures and conductive ink droplets formed by inkjet printing processes in accordance with yet another embodiment of the invention.

FIG. 4 is a plane view of the microstructures and conductive ink droplets formed by inkjet printing processes in accordance with yet another embodiment of the invention (in order to simply the drawing, the substrate of the circuit board is not shown). As shown in FIG. 4, this embodiment differs from the embodiment of FIGS. 2A and 2B in that the microstructures 404 are further arranged along the second direction D2 with a spacing therebetween and arranged along the first direction D1 in a staggered manner.

With the design described above, when the conductive ink droplets 410 exceeds the microstructures 404 in the second direction D2 along the recesses 406 between the microstructures 404, the conductive ink droplets 410 may not directly contact the adjacent conductive ink droplets 410, so that the subsequently formed circuits are not shorted. Therefore, the minimum spacing of circuits on the substrate can be reduced (i.e. the circuit density can be increased). For example, see FIG. 4, the spacing Sp between the microstructures 404 in the second direction D2 (equivalent to the spacing between the conductive ink droplets 410 and the subsequently formed circuits in the second direction D2) can be less than the diameter S of the conductive ink droplet 410 (i.e. Sp<S).

As described above, the invention provides a method utilizing inkjet printing technology for manufacturing a circuit board, comprising: providing a substrate; performing a first inkjet printing step to apply a plurality of ink droplets to the substrate to form a plurality of microstructures arranged along a first direction, wherein the microstructures therebetween form a plurality of recesses extended along a second direction that is different from the first direction; and performing a second inkjet printing step to apply a plurality of conductive ink droplets to the microstructures, wherein the recesses between the microstructures are filled with the conductive ink droplets. Thus, the continuity of the subsequently formed circuits can be increased and the binding stability between the substrate and circuits thereon can also be improved. Consequently, the reliability and life of the whole circuit board are further increased.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a circuit board, comprising:
    providing a substrate;
    performing a first inkjet printing step to apply a plurality of ink droplets to the substrate to form a plurality of microstructures arranged along a first direction, wherein the microstructures therebetween form a plurality of recesses extended along a second direction that is different from the first direction; and
    performing a second inkjet printing step to apply a plurality of conductive ink droplets to the microstructures, wherein the recesses between the microstructures are filled with the conductive ink droplets;
    wherein the microstructures each have a length in the first direction that is smaller than a diameter of each conductive ink droplet having a spherical structure, wherein the microstructures each have a width in the second direction that is perpendicular to the first direction, and the width is equal to or greater than the diameter of each conductive ink droplet, wherein the length of each of the microstructures is about one-half to three-quarters of the diameter of each of the conductive ink droplets, and the width of each of the microstructures is about one to two times the diameter of each of the conductive ink droplets.

2. The method as claimed in claim 1, wherein the microstructures each have a rectangular structure, and a major axis thereof is parallel to the second direction.

3. The method as claimed in claim 1, wherein the microstructures are arranged periodically, and the conductive ink droplets are coated periodically on the microstructures, and wherein an arrangement period of the microstructures is the same as and coincides with a coating period of the conductive ink droplets.

4. The method as claimed in claim 3, wherein the recesses each have a gap distance in the first direction that is equal to one another, and the microstructures each have a length in the first direction that is equal to one another, and wherein the gap distance equals a difference between the length of the microstructures and the arrangement period of the microstructures.

5. The method as claimed in claim 1, wherein the microstructures adhere to the substrate.

6. The method as claimed in claim 1, wherein the microstructures comprise non-conductive material.

7. The method as claimed in claim 1, wherein the substrate comprises a copper cladded laminate (CCL), a glass substrate, or a plastic substrate.

8. The method as claimed in claim 1, wherein the conductive ink droplets comprise metal particles and a dispersant.

9. The method as claimed in claim 8, wherein the conductive ink droplets further comprise a binder.

10. A method for manufacturing a circuit board, comprising:
    providing a substrate;
    performing a first inkjet printing step to apply a plurality of ink droplets to the substrate to form a plurality of microstructures arranged along a first direction, wherein the microstructures therebetween form a plurality of recesses extended along a second direction that is different from the first direction; and
    performing a second inkjet printing step to apply a plurality of conductive ink droplets to the microstructures, wherein the recesses between the microstructures are filled with the conductive ink droplets;
    wherein the microstructures each have a length in the first direction that is smaller than a diameter of each conductive ink droplet having a spherical structure, wherein the microstructures each have a width in the second direction that is perpendicular to the first direction, and the width is smaller than the diameter of each conductive ink droplet.

11. The method as claimed in claim 10, wherein the length and the width of each of the microstructures are both about one-half of the diameter of each of the conductive ink droplets.

12. The method as claimed in claim 10, wherein the microstructures each have a T-shaped cross section.

13. The method as claimed in claim 12, wherein the microstructures each have a lower portion connected to the substrate and an upper portion on the lower portion, the upper portion having a rectangular structure, and the lower portion has a rectangular structure, and wherein a major axis of the lower portion is parallel to the second direction.

14. The method as claimed in claim 13, wherein the upper and lower portions of each of the microstructures are formed by repeated printing.

15. A method for manufacturing a circuit board, comprising:
providing a substrate;
performing a first inkjet printing step to apply a plurality of ink droplets to the substrate to form a plurality of first microstructures arranged in a first line along a first direction and a plurality of second microstructures arranged in a second line along the first direction, wherein the first microstructures therebetween form a plurality of first recesses extended along a second direction that is different from the first direction, and the second microstructures therebetween form a plurality of second recesses extended along the second direction, wherein the first microstructures in the first line and the second microstructures in the second line have a spacing therebetween in the second direction and are arranged in a staggered manner; and
performing a second inkjet printing step to apply a plurality of conductive ink droplets to the first and second microstructures, wherein the first recesses between the first microstructures and the second recesses between the second microstructures are filled with the conductive ink droplets.

16. The method as claimed in claim 15, wherein the spacing between the first and second microstructures in the second direction is smaller than a diameter of each conductive ink droplet.

* * * * *